United States Patent [19]
Shen et al.

[11] Patent Number: 6,136,166
[45] Date of Patent: *Oct. 24, 2000

[54] APPARATUS FOR PRODUCING A UNIFORM MAGNETIC FIELD OVER A LARGE SURFACE AREA OF A WAFER

[75] Inventors: Yong Shen, Milpitas; Tai Min, San Jose; Yiming Huai, Pleasanton, all of Calif.

[73] Assignee: Read-Rite Corporation, Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/049,222

[22] Filed: Mar. 27, 1998

[51] Int. Cl.$^7$ .................................................. C23C 14/34
[52] U.S. Cl. .............................. 204/298.16; 204/298.15; 118/500; 118/723 R; 118/728; 156/345
[58] Field of Search ........................ 204/298.15, 298.16, 204/192.12; 118/723 MA, 723 MR, 500, 723 R, 728; 156/345; 216/70

[56] References Cited

U.S. PATENT DOCUMENTS

| | | | |
|---|---|---|---|
| 4,581,118 | 4/1986 | Class et al. | 204/298 |
| 4,871,433 | 10/1989 | Wagner et al. | 204/192.12 |
| 5,589,039 | 12/1996 | Hsu | 204/192.12 |
| 5,630,916 | 5/1997 | Gerrish et al. | 204/192.2 |
| 5,804,041 | 9/1998 | Hurwitt | 204/192.2 |

*Primary Examiner*—Julian A. Mercado
*Attorney, Agent, or Firm*—Nathan N. Kallman

[57] ABSTRACT

An apparatus for producing in a deposition system an aligned uniform magnetic field across a workpiece or a wafer having a large surface area includes spaced flux guides which are formed with tapered sections that narrow towards the central region of the wafer. Magnetic members which may be permanent magnets or electromagnets are disposed close to the wafer and co-act with the flux guides to achieve the desired uniform magnetic field. In this way, thin films deposited within the deposition system are formed with uniform thickness and magnetic properties.

8 Claims, 6 Drawing Sheets

6,136,166

APPARATUS FOR PRODUCING A UNIFORM MAGNETIC FIELD OVER A LARGE SURFACE AREA OF A WAFER

FIELD OF THE INVENTION

This invention relates to an apparatus for producing a uniform magnetic field over a large surface area during sputtering and deposition of thin films.

DESCRIPTION OF THE PRIOR ART

In prior art deposition systems, a uniform magnetic field is applied during sputtering and deposition of magnetic materials used for thin film magnetic heads, for example. The thin films are deposited on wafers that serve as substrates and are further processed to produce air bearing sliders on which the thin film heads are deposited. It is critical to provide an aligned field having uniform field strength over a large area in order to obtain thin films of uniform thickness and magnetic properties. One approach for providing a uniform magnetic field is disclosed in U.S. Pat. No. 5,290,416 wherein a unidirectional field generator is used wherein a permanent magnet assembly is located close to the wafer. In the prior art vacuum deposition systems, the available spacing between the wafer surface and the members of the magnetic apparatus is required to be very close so that a uniform magnetic field can be obtained across the wafer surface. The present trend is to work with wafers of larger sizes, such as 6 inch square or 8 inch diameter round wafers, which require more stringent techniques than used with prior art deposition systems. In the prior art, it will be difficult to scale up the magnetic apparatus over a large wafer while maintaining a strong uniform magnetic field.

Another prior art design of apparatus for providing magnetic fields which are applied to a wafer in a vacuum deposition system is shown in FIG. 1a. The strong magnetic field with high variation in vertical field component is localized close to the edges of the high permeability flux guide 16A and 16B, resulting in strong undesired interaction between the magnetic apparatus and deposition cathodes at those regions. Furthermore, variations in field strength of horizontal magnetic field component across the surface of the wafer during deposition of magnetic thin films are amplified wherein the field strength at the edge regions of the wafer are much higher than at the central regions such that the applied field is not uniform across the entire surface of the wafer. It has been found that with known prior art approaches the strength of the magnetic field varies significantly across an area, as depicted in FIG. 1b.

SUMMARY OF THE INVENTION

An object of this invention is to provide an apparatus that produces a uniform magnetic field across a large surface area of a wafer during deposition of magnetic thin films.

According to this invention, a system for depositing magnetic thin films includes an apparatus for producing an aligned uniform magnetic field across a large surface area of a wafer on which the thin films are deposited. To effectuate an aligned uniform magnetic field, flux guides that taper and narrow towards the center region of the wafer are used to shape the field at the center region of the wafer and simultaneously reduce the field strength at the edge regions of the wafer. The flux guides are made of a soft magnetic material with high permeability and high saturation moment, such as Permalloy and Silicon iron. In preferred embodiments, permanent magnets or electromagnets are used in conjunction with the tapered flux guides. The apparatus disclosed herein is useful for deposition of magnetic thin films, such as used to form the magnetic poles of magnetic yokes of inductive heads and to form magnetoresistive (MR) sensors of anisotropic (AMR) heads, giant magnetoresistive (GMR) heads and spin valve sensors.

BRIEF DESCRIPTION OF THE DRAWINGS

The invention will be described in greater detail with reference to the drawing in which:

FIG. 1b shows the distribution of the magnetic field H measured in Oersteds plotted against position across a surface to which the magnetic field is applied in FIG. 1a;

FIG. 2b is a cross-sectional view taken along line 2b of FIG. 2a;

FIG. 2c is an isometric view of the apparatus of FIG. 2a;

FIG. 3b is a cross-sectional view taken along line 3b of FIG. 3a;

FIG. 4b is a cross-sectional view taken along line 4b of FIG. 4a;

DETAILED DESCRIPTION OF THE INVENTION

Figure 1A:
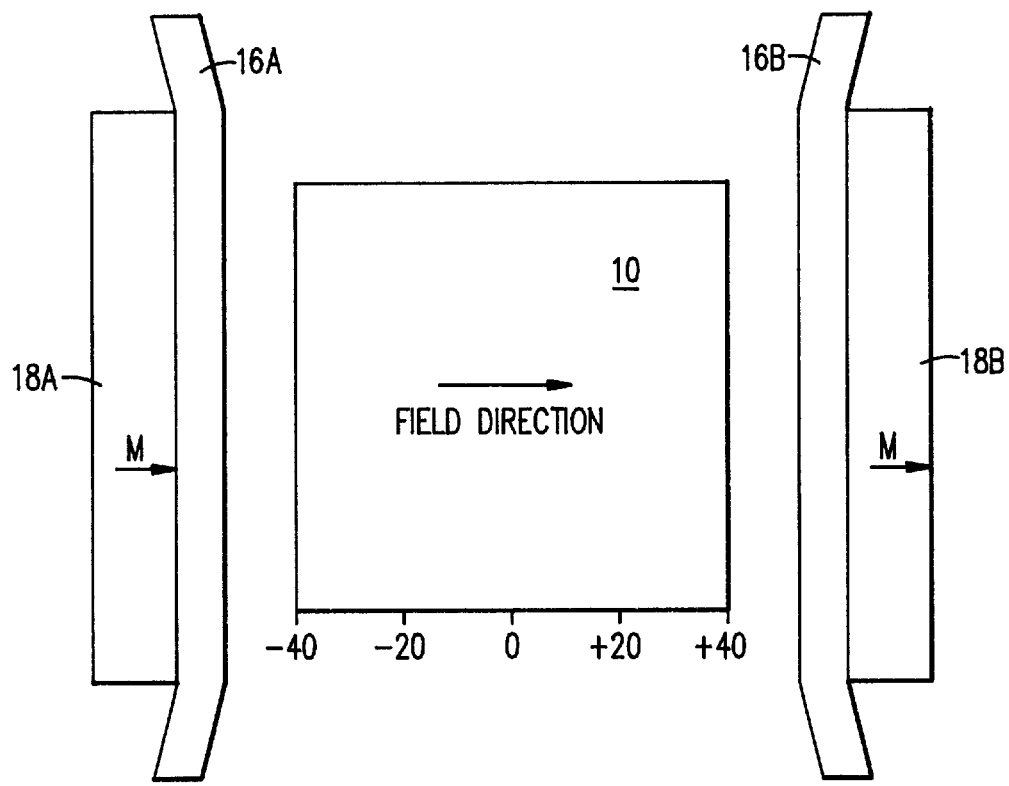
FIG. 1a is a representational plan view of a prior art apparatus for providing a magnetic field.
Figure 1B:
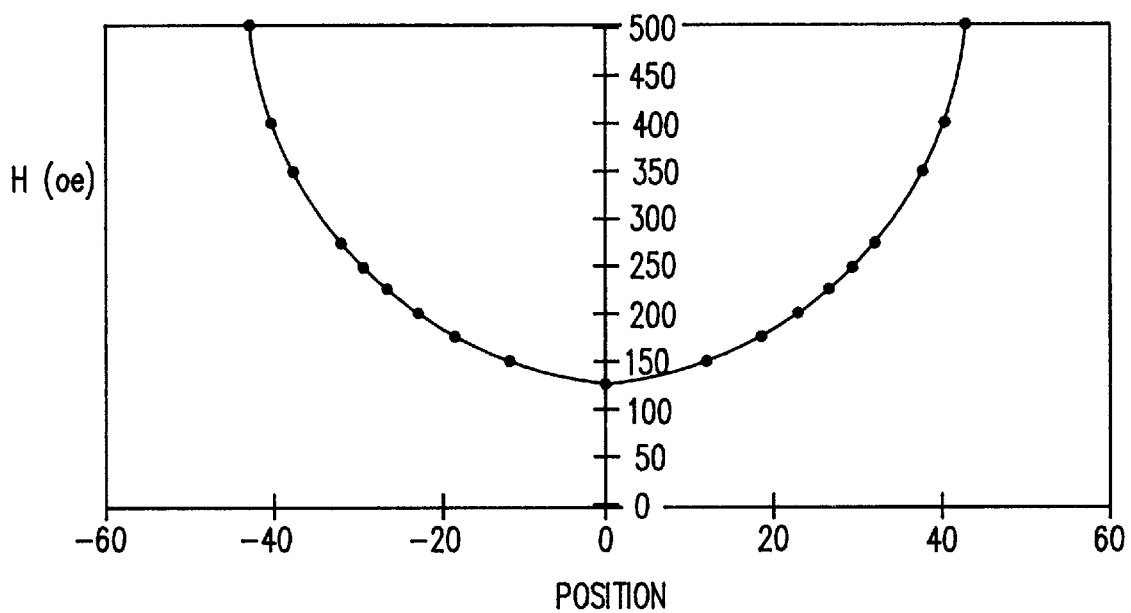

As shown in FIG. 1a, a prior art apparatus for providing a magnetic field across a wafer 10 includes two flux guides 16A and 16B made of high permeability material disposed adjacent to the wafer 10. The flux guides 16A and 16B have angled ends and are positioned at and spaced from opposing sides of the wafer. Permanent magnets 18A and 18B are located next to the flux guides 16A and 16B to provide a unidirectional field across the wafer surface in a direction as indicated by the arrow. The edge of flux guides 16A and 16B have been kept some distance away from the wafer 10 to prevent wafer from being in a region with high variation in magnetic field near the flux guide edge. FIG. 1b shows the variations in strength of the field H, measured in Oersteds, across the surface of the wafer 10 with the lowest strength or field intensity at the center region of the wafer between the flux guides and magnets.

Figure 2A:
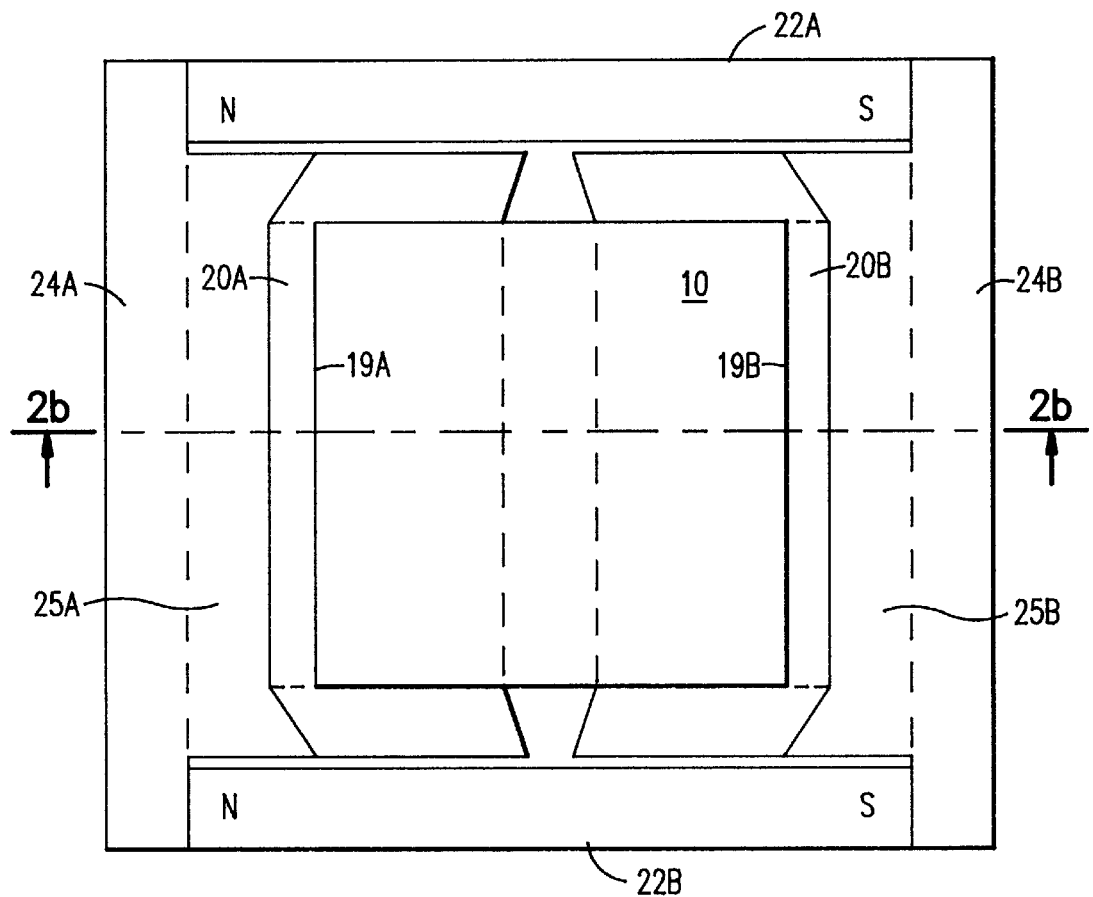
FIG. 2a is a representational plan view of an apparatus for providing an aligned magnetic field, in accordance with the present invention.
Figure 2B:
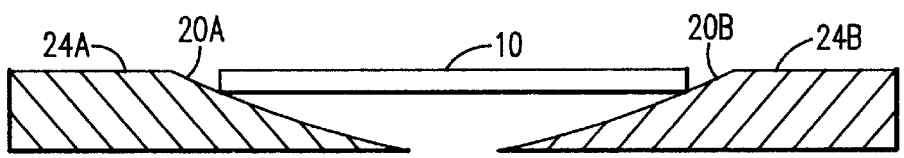
Figure 2C:
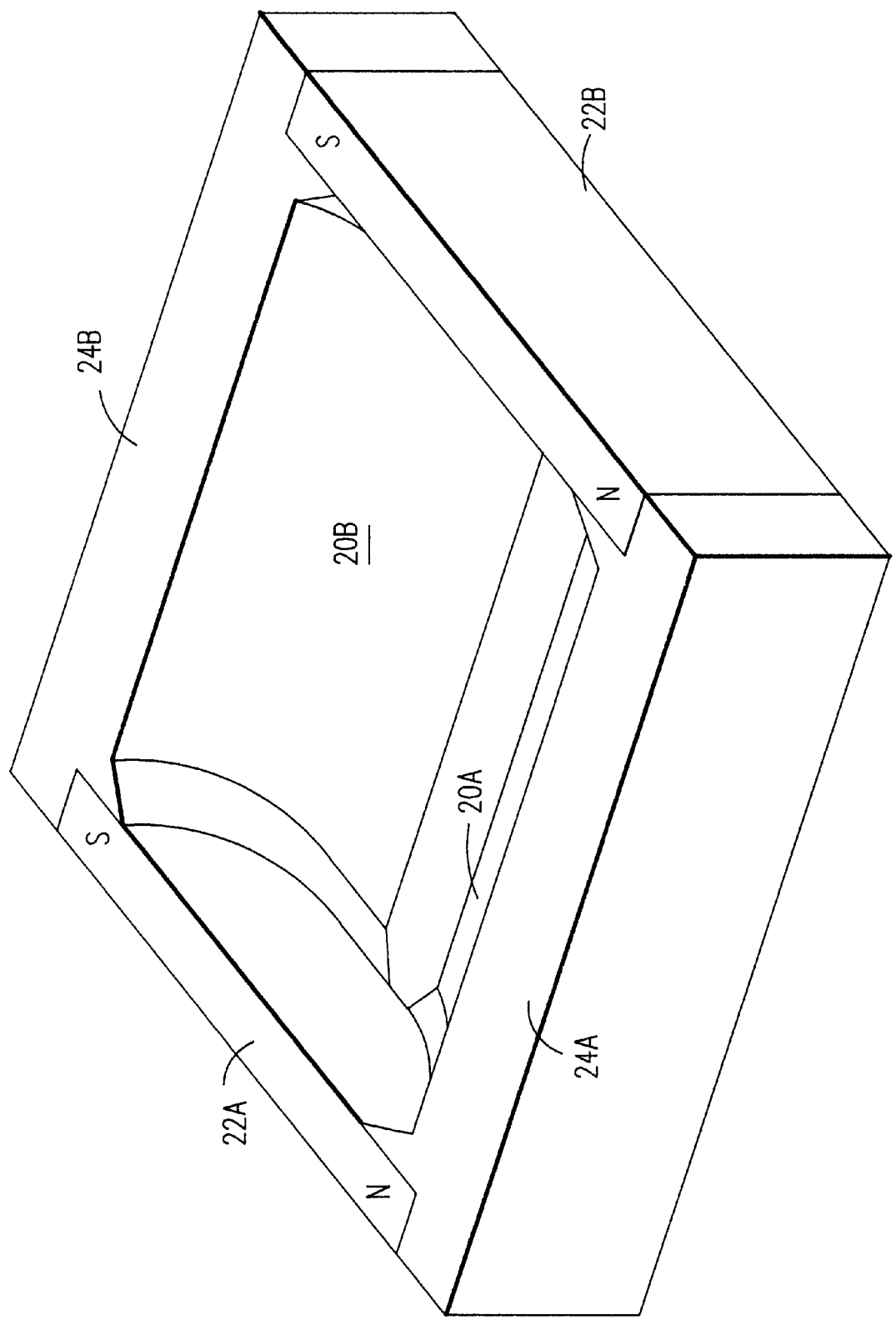

In keeping with this invention, and as depicted in FIGS. 2a–2c, flux guides are formed with substantially rectangular sections 24A, 24B at the regions furthest from the wafer 10 and tapered narrowing sections 20A, 20B at the regions closely adjacent to the wafer. The flux guides 24A, 24B include longitudinal segments 25A and 25B that are disposed adjacent to and are parallel with longitudinal segments 19A and 19B of the tapered narrowing sections 20A and 20B respectively. The flux guides are made of high permeability material and are positioned closely adjacent to the wafer on which thin films are to be deposited. Permanent magnets 22A and 22B are located at opposing sides of the wafer orthogonally to the lengths of the flux guides. In this implementation of the invention, it has been found that the flux lines of the applied magnetic field are substantially confined within wafer surface and that field strength across the surface areas of six inch square wafers is uniform during deposition of thin films used for inductive and magnetoresistive heads.

Figure 3A:
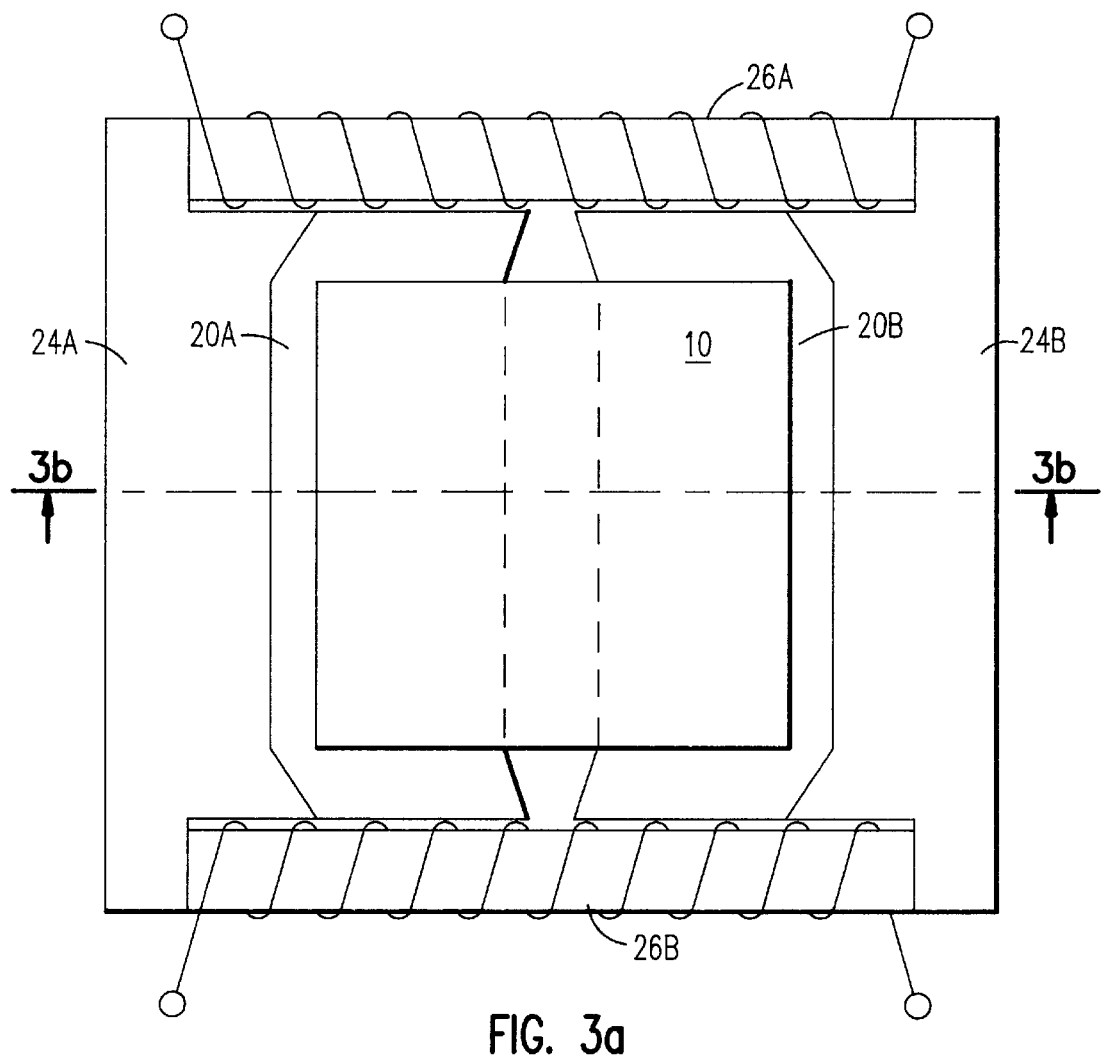
FIG. 3a is a representational view of an alternative embodiment of the invention.
Figure 3B:
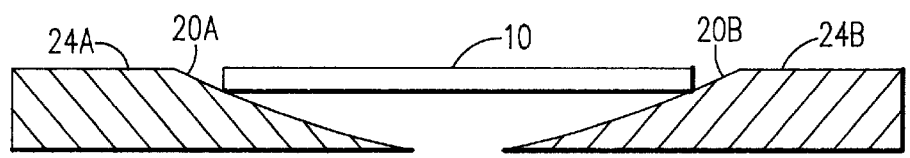

FIGS. 3a and 3b illustrate an alternative embodiment of the invention. In lieu of the permanent magnets 22A and 22B, electromagnets 26A and 26B are used. In this implementation, a direct current or alternating current is used to produce a magnetic field with tunable field strength. The soft magnetic materials of the high magnetic moment bars formed with the electromagnets 26A and 26B that replace the permanent magnets need to be saturated with current so that the electromagnets are not permeable to magnetic flux from the flux guides.

Figure 4A:
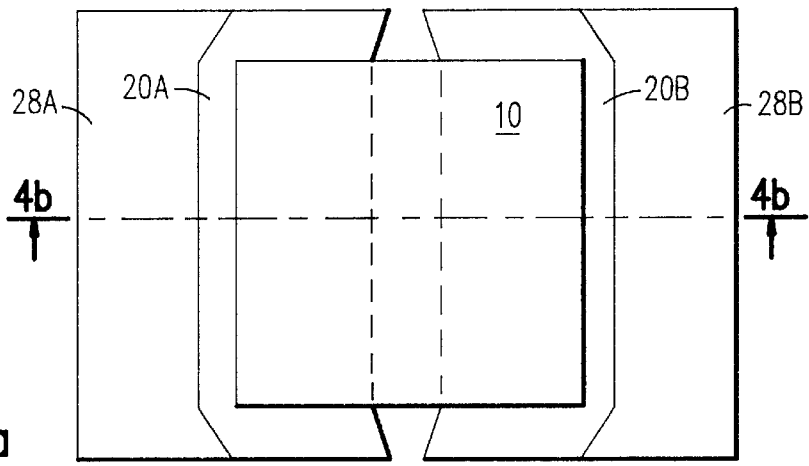
FIG. 4a is a representational view of another alternative embodiment of the invention.
Figure 4B:
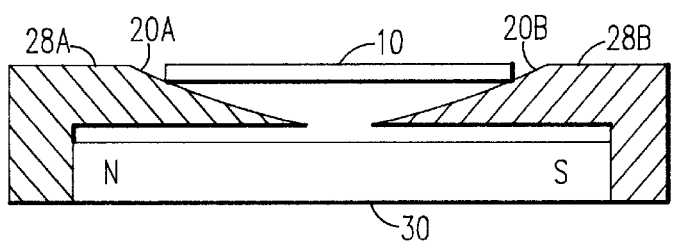

In the implementation shown in FIGS. 4a and 4b, the flux guides are formed with L-shaped sections 28A and 28B (rotated 90°) and the tapered portions 20A and 20B. A permanent magnet 30 is positioned between the L-shaped portions and under the tapered portions of the flux guides, in contrast with the embodiment of FIGS. 2a, 2b wherein permanent magnets 22A and 22B are located at the same plane as the flux guides.

Figure 5A:
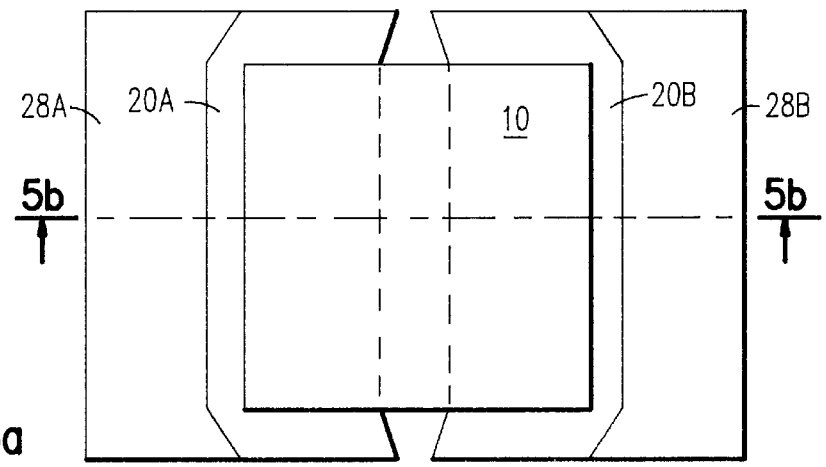
FIG. 5a is a representational view of another alternative embodiment of the invention.
Figure 5B:
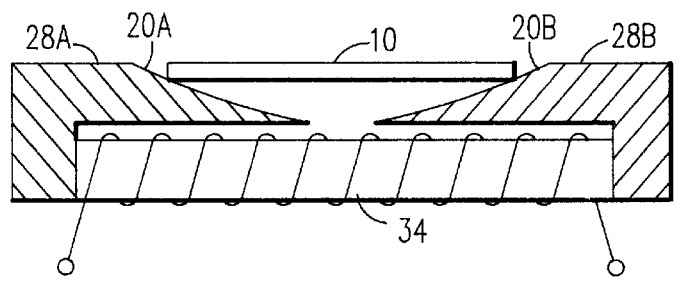
FIG. 5b is a cross-sectional view taken along line 5b of FIG. 5a. Similar numerals refer to similar elements throughout the drawings.

The alternative embodiment shown in FIGS. 5a and 5b uses an electromagnet 34 between the L-shaped portions and under the tapered portions of the flux guides, instead of the permanent magnet 30.

Figure 6A:
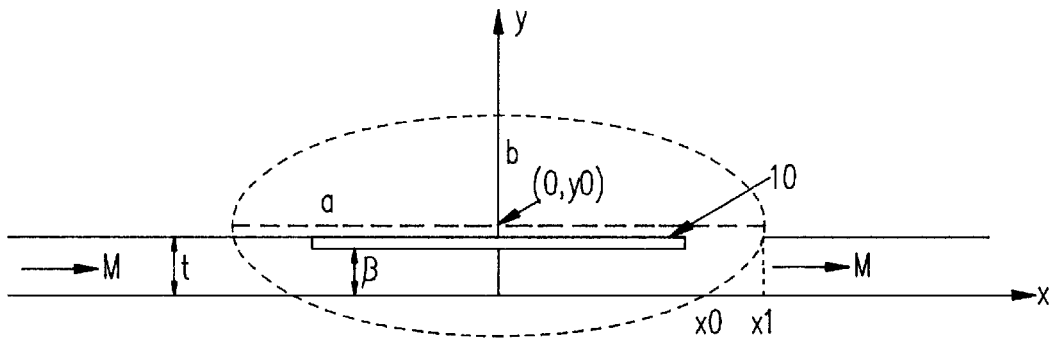
FIG. 6a is a model of a wafer and the apparatus of FIG. 2, which model is used for calculating magnetic field.
Figure 6B:
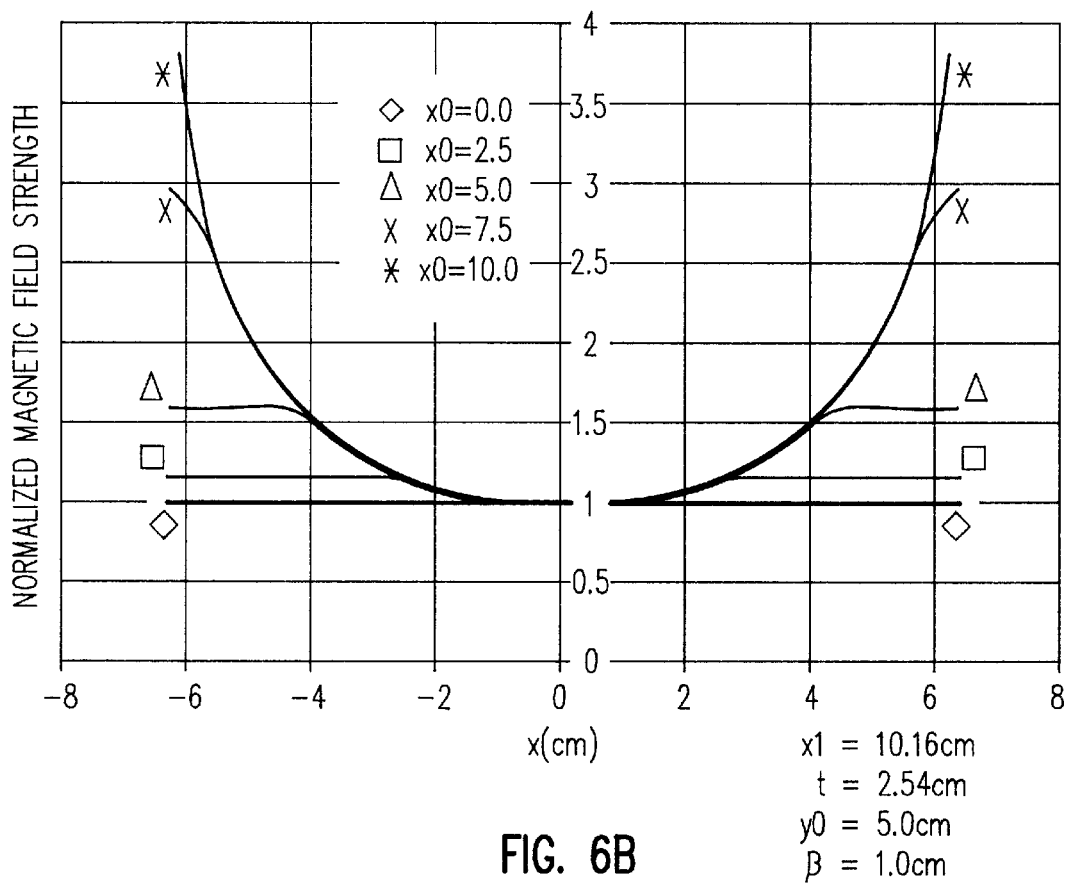
FIG. 6b is a graph of field strength distribution across the wafer as an end position of a tapered narrowing section of the apparatus is varied.

A model of the wafer and magnetic apparatus is shown in FIG. 6a to calculate magnetic field across the wafer. A tapered line of magnetic flux guide is represented as a segment of ellipse to provide more uniform magnetic field along the substrate surface. A center of the ellipse is at (0,y0) and long and short half-axes of the eclipse are a, and b. X0 and x1 are coordinates of the starting position of bottom and top surface of magnets. The flux guides have a thickness t and constant magnetization M along the horizontal plane. A magnetic charge at the tapered surface is therefore given by a product of M and cosine angle between normal of tapered surface and horizontal direction. The substrate is placed at a distance β to the bottom surface of magnet. The curvature of magnet surface is determined by the values of t, x0,x1, and y0, as does the magnetic field strength and distribution. In this model, x1 is fixed at 10.16 cm (4 inch), β is 1.0 cm. x0, t and y0 are varied to study the effect of magnet curvature on field uniformity. The field strength variation is most sensitive to end position of the taper (X0). FIG. 6B illustrates the field variation across the wafer with end position of the taper for the case where t=2.54 cm, y0=5.0 cm. As demonstrated in FIG. 6B, the field strength has the highest variation when flux guide facing the wafer has vertical straight wall. As the end of the tapered wall of the flux guide is extended toward the center, the field becomes more and more uniform and finally the field uniformity can be obtained within 2% as the end of the taper reaches the center of the wafer (X0=0.0).

In each embodiment disclosed herein, flux guides having tapered sections, with the narrowing portions extending towards the center of the wafer being processed, are provided to align the applied magnetic field and to produce a uniform magnetic field across the entire surface of the wafer. The novel apparatus can be used with large size wafers, square or circular, on which thin films are sputtered or deposited in a deposition system. Other applications include testing magnetic devices in the presence of uniform magnetic field.

What is claimed is:

1. An apparatus for providing a uniform magnetic field across the surface of a wafer having edge regions and a central region comprising:

a rectangular configuration including spaced flux guides formed of high permeability material disposed adjacent to said wafer, said flux guides being opposite to each other, said flux guides having tapered portions in contact with said edge regions of the wafer and extending to and narrowing towards said central region of the wafer, and outer rectangular sections adjacent to said tapered portions and spaced from the wafer by said tapered portions, said outer rectangular sections formed with longitudinal segments and said tapered portions formed with longitudinal segments that are parallel to and contiguous with said longitudinal segments of said outer rectangular sections, said longitudinal segments of said tapered portions having widths substantially narrower than the widths of said outer rectangular sections; and magnetic means located closely adjacent to said wafer;

whereby the magnetic field strength at the edge regions of the wafer is effectively reduced and the field at the central region of the wafer is shaped so that field intensity across the entire surface of the wafer is uniform.

2. An apparatus as in claim 1, wherein said magnetic means comprises at least one permanent magnet.

3. An apparatus as in claim 2, wherein said at least one permanent magnet comprises two spaced permanent magnets that are positioned closely adjacent to said wafer, said permanent magnets being opposite to each other and disposed orthogonally relative to the flux guides.

4. An apparatus as in claim 2, wherein said flux guides are formed with L-shaped sections and said at least one permanent magnet comprises a single permanent magnet positioned between said flux guides and under said tapered portions of said flux guides.

5. An apparatus as in claim 1, wherein said magnetic means comprises at least one electromagnet formed with a high permeability soft magnetic bar, and an electrical coil encompassing said bar for the application of electrical current.

6. An apparatus as in claim 5, wherein said at least one electromagnet comprises two spaced electromagnets orthogonal to said flux guides that are positioned closely adjacent to the wafer, said electromagnets being opposite to each other.

7. An apparatus as in claim 5, wherein said flux guides are formed with L-shaped sections and said at least one electromagnet comprises a single electromagnet positioned between said flux guides and under said tapered portions of said flux guides.

8. An apparatus as in claim 5, including means for applying an electrical current to said coil of said at least one electromagnet for saturating the bar of said electromagnet with current, so that the electromagnet is not permeable to magnet flux from said flux guides.

* * * * *